United States Patent [19]

Rezek et al.

[11] Patent Number: 4,647,320
[45] Date of Patent: Mar. 3, 1987

[54] METHOD OF MAKING A SURFACE EMITTING LIGHT EMITTING DIODE

[75] Inventors: Edward A. Rezek, Redondo Beach; Andre Burghard, Torrance; Alan L. Carpenter, Santa Monica, all of Calif.

[73] Assignee: TRW Inc., Redondo Beach, Calif.

[21] Appl. No.: 736,880

[22] Filed: May 22, 1985

[51] Int. Cl.[4] .......................................... H01L 21/368
[52] U.S. Cl. .................................. 148/171; 29/569 L; 29/576 E; 29/580; 148/172; 357/16; 372/46
[58] Field of Search ................. 29/569 L, 572, 576 E; 148/1.5, DIG. 99, 171, 172; 357/16, 17; 156/647; 29/580; 372/46

[56] References Cited

U.S. PATENT DOCUMENTS

| | | | |
|---|---|---|---|
| 4,360,919 | 11/1982 | Fudiwara et al. | 29/569 L |
| 4,480,331 | 10/1984 | Thompson | 29/569 L |
| 4,496,403 | 1/1985 | Turley | 29/569 L |
| 4,509,996 | 4/1985 | Greene et al. | 29/569 L |
| 4,538,342 | 9/1985 | Camlibel et al. | 29/589 X |
| 4,566,171 | 1/1986 | Nelson et al. | 29/576 E |
| 4,567,060 | 1/1986 | Hayakawa et al. | 29/569 L |
| 4,573,255 | 3/1986 | Gordon et al. | 29/569 L |

OTHER PUBLICATIONS

Hawrylo "LPE Growth of 1.3 um InGaAsP CW Lasers on (110) InP substrates", electron, Lett., vol. 17, No. 8, pp. 282–283, 16 Apr. 1981.
Nishitani "InGaAsP LPE Growth on InP and its Application to DH Lasers", Fuditsu Sci Tech J, vol. 18, no. 3, pp. 419–436, Sep. 1982.

Primary Examiner—George T. Ozaki
Attorney, Agent, or Firm—Noel F. Heal; Robert J. Stern

[57] ABSTRACT

A light-emitting diode and corresponding method for its fabrication, in which a blocking layer is used for current confinement, and a rectangular light emission pattern is employed, to avoid anisotropic effects when material systems such as indium phosphide are used. A critical step in the method of the invention is etching an opening through the blocking layer. The opening has its sides precisely oriented at forty-five degrees with respect to the cleavage planes of the substrate, to avoid exposing any crystal planes that are anisotropic.

7 Claims, 3 Drawing Figures

METHOD OF MAKING A SURFACE EMITTING LIGHT EMITTING DIODE

BACKGROUND OF THE INVENTION

This invention relates generally to light-emitting diodes and, more particularly, to surface-emitting light-emitting diodes (LEDs). Light-emitting diodes are semiconductor devices operating on a well-known principle whereby light is emitted from a forward-biased junction between selected semiconductor materials. The semiconductor structure of a light-emitting diode is similar to that of a laser diode, except that the light-emitting diode incorporates some mechanism to inhibit lasing but still allow emission of light.

Briefly, the diode structure includes a substrate of a selected conductivity type, a first cladding layer of the same conductivity type, a thin active layer, and a second cladding layer of the opposite conductivity type. On top of the second cladding layer is a cap layer, and metallized contacts are applied to the cap layer and to the underside of the substrate. When the device is electrically forward-biased, i.e. a voltage is applied in the direction of current flow most favored by the diode, photons are emitted from the active layer at the junction between the two cladding layers.

In one form of the diode, based on a gallium arsenide material system, the current through the junction is confined to a selected small area by the inclusion of a blocking layer between the substrate and the first cladding layer. The blocking layer is of opposite conductivity type opposite to that of the substrate and covers the substrate except for a small area selected for current flow. The voltage applied to the device forward-biases the principal diode junction, but reverse-biases the junction between the substrate and the blocking layer. THerefore, current is inhibited from flowing through the blocking layer and is substantially confined to the selected area in which the substrate is not masked by the blocking layer. The metallization on the cap layer has an opening or window through which light is emitted from the device, and the opening is preferably coated with an anti-reflection coating. The effect of this current confinement technique is to improve the performance of the device by increasing the efficiency, power output, and power-bandwidth product.

In the surface-emitting, current-confinement type of light-emitting diode described, it is preferable to emit a circular pattern of light. A circular pattern is especially more convenient when the output of the diode is to be coupled to an optical fiber. However, it is virtually impossible to obtain a circular emission pattern from a device of this type using a material system based on indium phosphide. This property of indium phosphide devices is unfortunate because the characteristic wavelengths emitted from diodes using an indium phosphide material system are very well suited for use in communications over optical fibers. Circular emission patterns can be obtained from diodes fabricated using a gallium arsenide material system, but the wavelength emitted from these devices is far less desirable for communications use, since losses and dispersion are much greater for the gallium arsenide material system.

The principal difficulty with diodes of this type based on an indium phosphide material system is that, because of the inherent crystalline structure of indium phosphide, it is virtually impossible to etch a circular hole in the material by conventional etching methods, to define the current confinement area. Since indium phosphide is anisotropic in nature, the etched area inevitably becomes elliptical in shape, and the resulting light emission pattern is unacceptable for some applications of the diode. An equally important consideration is that, after etching an opening in the indium phosphide blocking layer, the growth of the first cladding layer is difficult to achieve reproducibly, and the layer may even become "shorted out" electrically to the substrate, resulting in no emission of light. Although special etching procedures may be employed to obtain a circular opening in indium phosphide, the circular shape will, in any event, be modified during the subsequent step of growing the first cladding layer.

It will be appreciated from the foregoing that there is still a need in this area for a technique that avoids these difficulties and provides a current-confinement light-emitting diode with a more symmetrical light emission pattern, even when the material system is indium phosphide. As will now be summarized, the present invention satisfies this need.

SUMMARY OF THE INVENTION

The present invention resides in a light-emitting diode structure, and a corresponding method for its fabrication, in which current confinement can be achieved conveniently in an anisotropic material such as indium phosphide. Briefly, and in general terms, the method of the invention includes the steps of taking a semiconductor substrate of anisotropic material of a selected conductivity type, and with cleavage planes oriented at 90° to each other, forming a semiconductor blocking layer of an anisotropic material of opposite conductivity type to that of the substrate, and etching a rectangular opening through the blocking layer, the sides of the rectangular opening being oriented 45° to the cleavage planes of the substrate material. This selection of orientation angle for the etched opening permits the etching step to be performed without distortion of the shape of the opening. The subsequent steps are: forming a first cladding layer over the substrate and the blocking layer, the first cladding layer having the same conductivity type as the substrate, forming an active layer over the first cladding layer, and forming a second cladding layer over the active layer, the second cladding layer having an opposite conductivity type to that of the substrate. The step of forming the first cladding layer can be performed reproducibly in accordance with the method of the invention. This is to be contrasted with the problems that have arisen when circular openings are attempted.

In the preferred embodiment of the invention, the opening etched into the blocking layer is square in shape, and the resulting light emission area is also square. This provides a desirable symmetry to the shape of the emission pattern, which is much more preferable to the elliptical shape otherwise obtainable.

Briefly, the structure of the invention includes a substrate of anisotropic material, on which is formed a semiconductor blocking layer of opposite conductivity type to that of the substrate. The blocking layer has an etched opening that is rectangular in shape, the sides of the rectangle being oriented at forty-five degrees to the cleavage planes of the substrate. The structure further includes a first cladding layer formed over the substrate and the blocking layer, an active layer formed over the first cladding layer, and a second cladding layer formed over the active layer. The first cladding layer is of the same conductivity type as the substrate and the second cladding layer is of opposite conductivity type. The complete diode structure also includes a cap layer over the second cladding layer, and metallization layers over the cap layer and on the underside of the substrate. When a voltage is applied between the substrate and the cap layer, the junction at the active layer is forward-biased, but the substrate-blocking layer junction is reverse-biased, thereby confining the current to flow in the region of the rectangular opening. The metallization layer over the cap layer includes an opening through which light is emitted from the device, and is covered with an anti-reflection coating to improve the emission characteristics of the device.

In the presently preferred embodiment of the invention, the anisotropic material is indium phosphide (InP), and the active layer is of indium gallium arsenide phosphide (InGaAsP). The device may be fabricated on either a p type substrate or an n type substrate, with the conductivity types of the various layers being selected accordingly.

It will be appreciated from the foregoing that the present invention represents a significant advance in the field of light-emitting diodes. In particular, the invention provides a diode of the current-confinement type, and a related method for its manufacture, using an indium phosphide material system, but without any of the problems usually inherent in the use of this material system. Other aspects and advantages of the invention will become apparent from the following more detailed description, taken in conjunction with the accompanying drawings.

DESCRIPTION OF THE PREFERRED EMBODIMENT

Figure 1:
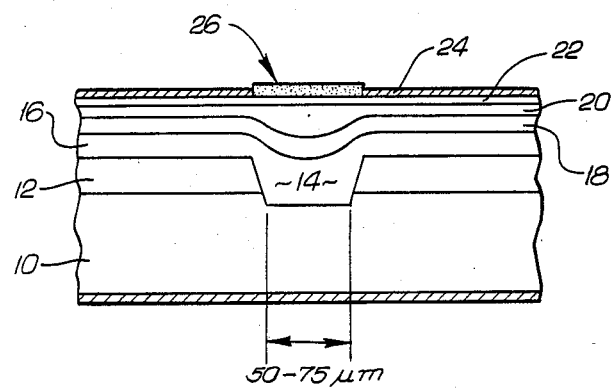
FIG. 1 is a simplified cross-sectional view of a surface-emitting light-emitting diode including a blocking layer for current confinement.
Figure 2:
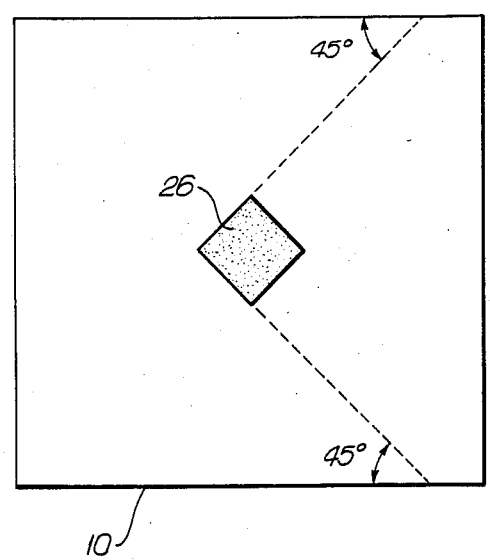
FIG. 2 is a diagrammatical plan view of the device, showing the emitting area in relation to the cleaved edges of the substrate.
Figure 3:
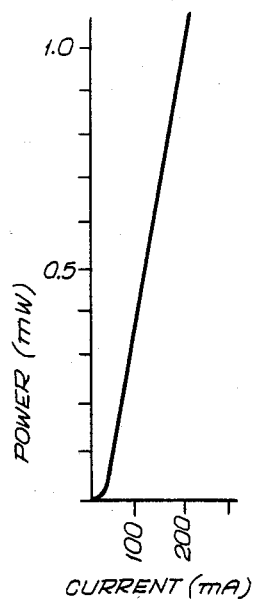
FIG. 3 is a graph showing the variation of output power with drive current for the diode of the invention.

As shown in the drawings for purposes of illustration, the present invention is concerned with light-emitting diodes of the surface-emitting type. FIG. 1 shows the cross section of a diode employing a known principle of current confinement. The device includes a substrate, indicated by reference numeral 10, on which is formed a blocking layer 12, using a material of opposite conductivity type to that of the substrate. For example, if the substrate 10 is of p type material, the blocking layer is of n type material. An opening 14 is etched through the blocking layer 12, and then a first cladding or confinement layer 16 is formed over the substrate 10 and the blocking layer 12. The remaining diode heterostructure layers include an active layer 18 formed over the first cladding layer 16, and a second cladding layer 20 formed over the active layer. The first cladding layer 16 is of the same conductivity type as the substrate 10, and the second cladding layer is of the opposite conductivity type. A cap or contact layer 22 of the same conductivity type as the second cladding layer 18 is formed over the latter layer, and a metallization layer 24 is formed over the cap layer. The metallization layer 24 has an opening 26 through it, in which is preferably formed an anti-refection coating. Electrical contact with the device is established at the metallization layer 24 and another metal layer 28 on the underside of the substrate 10.

When the junction between the two cladding layers 18 and 20 is forward-biased by the application of a suitable voltage between the metallization layers 24 and 28, current flows through the device and light is emitted from the active layer 18, emerging from the opening 26 in the upper metallization layer.

From an applications standpoint, it is most desirable to obtain a circular light pattern from the device. The circular pattern is most suitable for coupling the output of the device to optical fibers without significant dispersion and losses. If the materials used in the diode are based on gallium arsenide, there is relatively little difficulty in making the etched opening 14 circular, since gallium arsenide is substantially isotropic. However, the wavelength of light emitted from a diode based on a gallium arsenide material system, approximately 0.83 micron (micrometer), is not well suited for use in fiber-optic communications systems. It is much more convenient to employ wavelengths of 1.3 or 1.5 microns, which are available from devices based on an indium phosphide material system.

Unfortunately, however, indium phosphide is anisotropic in nature, and it is almost impossible to form a circular opening in the material. If a circular pattern is attempted, an elliptical one usually results, and a circular etch pattern will expose every crystallographic plane during etching.

It is appropriate at this point to explain briefly the convention frequently employed in describing various planes in a crystalline structure. The convention uses three-digit descriptions called Miller indices. The Miller indices are determined by first finding the intercepts of a plane of interest with the three basic orthogonal axes, in terms of lattice constants, and then taking the reciprocals of these numbers and reducing them to the smallest three integers having the same ratio. The integers are usually expressed within parentheses. In a cubic crystal with its edges aligned with the x-y-z orthogonal axes, some important planes are the (100) plane, which is parallel with the y-z plane, the (110) plane, which is a plane parallel with the z direction and in which two diagonally opposite edges of the cube lie, and the (111) plane, which is a diagonal plane intersecting three corners of the cube.

In indium phosphide (InP), there are two classes of (111) crystal planes. One is referred to as the (111)A plane, in which the Group III sublattice, i.e. indium, is exposed. Group III refers to the group in the periodic table of chemical elements. In indium phosphide, indium is the Group III material. The other class of (III) plane is referred to as the (111)B plane, in which the Group V sublattice, i.e. phosphorus, is exposed. The two planes are essentially oriented ninety degrees apart, and are not equivalent. Specifically, the (111)A plane is much less reactive than the (111)B plane. Therefore, the (111)A plane etches much more slowly that the (111)B plane, and any attempt to etch a circular opening will normally result in an elliptical opening.

A related difficulty is in the formation of the first cladding layer 16 after the etching step. If both the (111)A and the (111)B planes have been exposed by etching, growth by liquid-phase epitaxy (LPE) will favor the more reactive (111)B plane. The LPE growth process does not nucleate on the (111)A face as easily as on the (111)B face, and the growth step is not easily reproducible. Moreover, rapid growth on the (111)B plane locally depletes the LPE melt in the vicinity of the other crystal planes. The epitaxial layer may not grow at all on the (111)A plane if both plane types are exposed by etching. This means that the epitaxial layer is discontinuous, and in some local areas the substrate 10 may be exposed. This can lead to electrically "shorting out" the device to the substrate 10. The current-voltage characteristic of the resulting device will then be that of a resistor having the resistance of the substrate, and the device will emit no light at all.

Another related difficulty associated with attempts to obtain a circular emission pattern results from preferential evaporation of phosphorus from the exposed crystal planes. Before beginning the LPE growth of the first cladding layer 16, the structure is exposed to a temperature of 580°–650° C. for about one hour. At 500° C. or above, phosphorus will evaporate from the substrate 10, but will evaporate more from the (111)B plane than from the (111)A plane. The net effect of this preferential evaporation is that, even if a circular opening were to be etched by special techniques, the circular shape would inevitably be modified into an elliptical one. Moreover, the LPE growth would not occur normally. At the start of any LPE step, there is always a small portion of the substrate that is etched back as the LPE melt comes into equilibrium with the substrate. During this process, the more reactive (111)B plane is affected the most, other crystal planes are also affected, but the (111)A plane is virtually unaffected by the melt-back. The net effect is that a circularly etched opening will be modified during the LPE growth step, to preferentially expose some portion of the (111)A plane. The LPE growth will, therefore, not occur normally.

In accordance with the invention, the circular etched opening is abandoned in favor of a square or rectangular one. The sides of the square or rectangle must be oriented as precisely as possible at 45° to the cleavage planes of the substrate material. For a (100) oriented substrate, these (110) planes are at 90° to each other and are aligned with the cleaved edges of the substrate. Precisely orienting the square or rectangular pattern with its sides at 45° to the (110) cleavage planes places the corners of the pattern on the (111) crystal planes, and places the sides of the pattern in (100) crystal planes.

This orientation of the etched pattern exposes only the (100) planes. All (100) planes are equivalent, and all react identically to the etching step and to the subsequent LPE growth step. The (111) crystal planes are not exposed during etching, and in particular the (111)A plane is not exposed. Therefore, etching and the subsequent LPE growth step can proceed without any of the unwanted effects resulting from the anisotropic nature of the material. The LPE growth occurs isotropically on all (100) planes, and the growth completely covers the etched area of the substrate, without unwanted discontinuities.

In one preferred embodiment of the invention, the substrate 10 is of p type indium phosphide, and a preliminary step is growing a buffer layer 30 of p type indium phosphide. A thickness of 1-15 microns is required, and a doping concentration of from $5 \times 10^{16}$ to $5 \times 10^{18}$ cm$^{-3}$. This is a liquid-phase epitaxial (LPE) growth step, and is followed by another LPE step to grow the blocking layer 12. This is an n type indium phosphide layer, 0.25-10 microns thick and having a doping concentration in the range $5 \times 10^{16}$ to $5 \times 10^{19}$ cm$^{-3}$.

Using conventional photolithographic techniques, the opening 14 is etched through the blocking layer 12 and into the buffer layer 30. The etching process may employ any of a variety of approaches, such as wet etching with a suitable chemical etchant, or reactive ion etching or some other dry etching process. Etchants successfully employed in this step include bromine: methanol (0.5% bromine), HCl:H$_3$PO$_4$ (1:1), and HCl:CH$_3$COOH:H$_2$O$_2$ (1:2:1).

After etching, the second principal LPE growth step is preformed, to form the first cladding layer 16. This is p type indium phosphide of 0.25-10 microns thickness and a doping concentration in the range $5 \times 10^{16}$ to $5 \times 10^{18}$ cm$^{-3}$. Next, the active layer 18 is formed. This of indium gallium arsenide phosphide (InGaAsP), of 0.05-5 microns thickness and a doping concentration in the range $5 \times 10^{16}$ to $5 \times 10^{19}$ cm$^{-3}$, which may be p type or n type.

The second cladding layer 20 is of n type indium phosphide, of thickness 0.25-10 microns and a doping concentration from $5 \times 10^{16}$ to $5 \times 10^{19}$ cm$^{-3}$. Finally, the cap layer 22 is of n type indium phosphide, having a thickness of 0.25-5 microns and a doping concentration in excess of $10^{18}$ cm$^{-3}$.

The semiconductor wafer in this grown condition is then fabricated into a device structure. The anti-reflection coating is first deposited over the entire cap layer 22. The coating can be a silicon nitride (Si$_x$N$_y$) or indium tin oxide (ITO). The deposition of this layer may be by electron beam evaporation, radio-frequency (rf) sputtering, plasma-enhanced chemical vapor deposition (PECVD), or chemical vapor deposition (CVD). Using conventional photolithographic techniques, the anti-reflection coating is removed except over the selected square etched area. Standard p type and n type metallizations are then applied to the structure.

The device of the invention may also be fabricated on an n type substrate. In this case, the conductivity types of the various layers are reversed, except for the cap layer 22. This is replaced with a cap layer of p type indium gallium arsenide phosphide (InGaAsP) or indium gallium arsenide (InGAAs), 0.25-5 microns thick and having a doping concentration in excess of $10^{18}$ cm$^{-3}$. Another difference in the n type substrate device is that the cap layer 22 has to be selectively etched away over the etched opening 14, prior to the deposition of the anti-reflection coating.

It will be appreciated from the foregoing that the present invention represents a significant advance in the field of light-emitting diodes. In particular, the invention provides a technique for fabricating a current-confinement type of light-emitting diode using an anisotropic material system, such as indium phosphide, but without the disadvantages usually associated with such a material system. It will also be appreciated that, although a specific embodiment of the invention has been described in detail for purposes of illustration, various modifications may be made without departing from the spirit and scope of the invention. Accordingly, the invention is not to be limited except as by the appended claims.

We claim:

1. A method for making a light-emitting diode of the surface-emitting type from a material system that has anisotropic properties, comprising the steps of:

taking a semiconductor substrate of anisotropic material of a selected conductivity type, and having cleavage planes oriented at ninety degrees to each other;

forming a semiconductor blocking layer of an anisotropic material of opposite conductivity type to that of the substrate;

etching a rectangular opening through the blocking layer, the sides of the rectangular opening being oriented at forty-five degrees to the cleavage planes of the substrate material;

forming a first cladding layer over the substrate and the blocking layer, the first cladding layer having the same conductivity type as the substrate;

forming an active layer over the first cladding layer; and forming a second cladding layer over the active layer, the second cladding layer having the opposite conductivity type to that of the substrate;

whereby application of a forward bias voltage between the second cladding layer and the substrate results in confinement of current to the rectangular opening and surface emission of light from the rectangular opening, and whereby the rectangular opening can be etched by conventional techniques and will not inhibit the formation of the first cladding layer.

2. A method as set forth in claim 1, in which:
the rectangular opening is square.

3. A method as set forth in claim 2, in which:
the substrate material is indium phosphide;
the first and second cladding layers are of indium phosphide and of opposite conductivity types; and
the active layer is of indium gallium arsenide phosphide.

4. A method as set forth in claim 2, and further comprising the steps of:
forming a cap layer over the second cladding layer;
forming an anti-reflection coating over the cap layer;
removing all but a selected area of the anti-reflection coating over the etched opening; and
forming metallization layers for making electrical contact with the device.

5. A method for making a light-emitting diode of the surface-emitting type from an indium phosphide material system, comprising the steps of:
taking a semiconductor substrate of indium phosphide of a selected conductivity type, and having (110) cleavage planes oriented at ninety degrees to each other;

forming by liquid-phase epitaxy a semiconductor blocking layer of indium phosphide of opposite conductivity type to that of the substrate;

etching a rectangular opening through the blocking layer, the sides of the rectangular opening being oriented at forty-five degrees to the (110) cleavage planes of the substrate material;

forming by LPE a first cladding layer over the substrate and the blocking layer, the first cladding layer having the same conductivity type as the substrate and being of indium phosphide;

forming by liquid phase epitaxy an active layer over the first cladding layer, the active layer being of indium gallium arsenide phosphide; and forming by liquid phase epitaxy a second cladding layer over the active layer, the second cladding layer having the opposite conductivity type to that of the substrate and also being of indium phosphide;

whereby application of a forward bias voltage between the second cladding layer and the substrate results in the confinement of current to the rectangular opening and the surface emission of light from the rectangular opening, and whereby the rectangular opening can be etched by conventional techniques and will not inhibit the formation of the first cladding layer.

6. A method as set forth in claim 5, in which:
the rectangular opening is square.

7. A method as set forth in claim 6, and further comprising the steps of:
forming by liquid phase epitaxy a cap layer of indium phosphide over the second cladding layer, and having the same conductivity type as the second cladding layer;
forming an anti-reflection coating over the cap layer;
removing all but a selected area of the anti-reflection coating over the etched opening; and
forming metallization layers for making electrical contact with the device.

* * * * *